(12) United States Patent
Mu

(10) Patent No.: US 12,238,915 B2
(45) Date of Patent: Feb. 25, 2025

(54) METHOD FOR MANUFACTURING SEMICONDUCTOR STRUCTURE AND SAME

(71) Applicant: CHANGXIN MEMORY TECHNOLOGIES, INC., Anhui (CN)

(72) Inventor: Kejun Mu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 581 days.

(21) Appl. No.: 17/545,239

(22) Filed: Dec. 8, 2021

(65) Prior Publication Data

US 2023/0019583 A1 Jan. 19, 2023

Related U.S. Application Data

(63) Continuation of application No. PCT/CN2021/117288, filed on Sep. 8, 2021.

(30) Foreign Application Priority Data

Jul. 19, 2021 (CN) .......................... 202110813573.6

(51) Int. Cl.
- *H01L 21/00* (2006.01)
- *H10B 12/00* (2023.01)
- *H01L 23/522* (2006.01)

(52) U.S. Cl.
CPC ............. *H10B 12/09* (2023.02); *H10B 12/50* (2023.02); *H01L 23/5226* (2013.01)

(58) Field of Classification Search
CPC ...... H10B 12/09; H10B 12/50; H01L 23/5226
See application file for complete search history.

(56) References Cited

U.S. PATENT DOCUMENTS

| | | |
|---|---|---|
| 6,350,642 B1 | 2/2002 | Lee |
| 8,247,304 B2 | 8/2012 | Youn |
| 9,484,296 B2 | 11/2016 | Takahashi |
| 9,515,085 B2 | 12/2016 | Rabkin |
| 10,163,688 B2 | 12/2018 | Chen |

(Continued)

FOREIGN PATENT DOCUMENTS

| | | |
|---|---|---|
| CN | 107946237 A | 4/2018 |
| CN | 110875319 A | 3/2020 |
| CN | 110890345 A | 3/2020 |

*Primary Examiner* — Richard A Booth
(74) *Attorney, Agent, or Firm* — Kilpatrick Townsend & Stockton LLP

(57) ABSTRACT

A method for manufacturing a semiconductor structure and a semiconductor structure are provided. The method includes: providing a base; forming a lower dielectric layer; forming a first lower conductive pillar located in an array area, a second lower conductive pillar located in a peripheral area and a third lower conductive pillar located in a core area; forming an upper dielectric layer that exposes top surfaces of the first lower conductive pillar, the second lower conductive pillar and the third lower conductive pillar; and forming a first upper conductive pillar, a second upper conductive pillar and a third upper conductive pillar that are located within the upper dielectric layer; in which the third upper conductive pillar and the third lower conductive pillar constitute a third conductive pillar, and a top surface area of the third lower conductive pillar is larger than a top surface area of the third upper conductive pillar.

15 Claims, 12 Drawing Sheets

(56) References Cited

U.S. PATENT DOCUMENTS

| | | |
|---|---|---|
| 10,354,956 B1 | 7/2019 | Yu et al. |
| 10,535,660 B1 | 1/2020 | Chuang |
| 10,535,669 B2 | 1/2020 | Wang |
| 10,741,417 B2 | 8/2020 | Tien |
| 10,770,468 B2 | 9/2020 | Wang |
| 10,937,732 B2 | 3/2021 | Yang |
| 2008/0079169 A1 | 4/2008 | Maekawa |
| 2009/0152677 A1 | 6/2009 | Horikawa |
| 2010/0221889 A1 | 9/2010 | Youn |
| 2011/0193232 A1* | 8/2011 | Chen .................. H01L 23/3192 |
| | | 438/668 |
| 2012/0025370 A1* | 2/2012 | Wholey ............... H01L 23/367 |
| | | 257/737 |
| 2014/0264923 A1 | 9/2014 | Chen et al. |
| 2016/0093635 A1 | 3/2016 | Rabkin et al. |
| 2016/0240476 A1 | 8/2016 | Takahashi et al. |
| 2019/0157280 A1 | 5/2019 | Wang et al. |
| 2019/0164781 A1 | 5/2019 | Tien et al. |
| 2020/0083162 A1 | 3/2020 | Yang |
| 2020/0126999 A1 | 4/2020 | Wang et al. |
| 2020/0212041 A1 | 7/2020 | Machkaoutsan |
| 2020/0373171 A1 | 11/2020 | Tien et al. |
| 2021/0167010 A1 | 6/2021 | Yang |
| 2021/0280434 A1 | 9/2021 | Tien et al. |
| 2024/0206158 A1* | 6/2024 | Wang .................. H10B 12/482 |

* cited by examiner

METHOD FOR MANUFACTURING SEMICONDUCTOR STRUCTURE AND SAME

CROSS-REFERENCE TO RELATED APPLICATIONS

This application is a continuation application of International Application No. PCT/CN2021/117288, filed on Sep. 8, 2021, which claims priority to Chinese Patent Application No. 202110813573.6, filed on Jul. 19, 2021. The disclosures of International Application No. PCT/CN2021/117288 and Chinese Patent Application No. 202110813573.6 are hereby incorporated by reference in their entireties.

BACKGROUND

With the development of semiconductor technology, the process node of semiconductor structure is shrinking, and thus the integration degree is increasing. The improvement of integration degree mainly brings the following benefits. Firstly, the function of the semiconductor structure may be increase. Secondly, according to Moore's law, the direct result of the improvement of integration degree is cost reduction. Thirdly, the overall supply voltage of the semiconductor structure may be reduced, thereby reducing power consumption.

The manufacturing process of the semiconductor structure and the performance of the semiconductor structure need to be further improved for the purpose of achieving a smaller process node.

SUMMARY

The embodiments of the present disclosure relate to a method for manufacturing a semiconductor structure and a semiconductor structure.

According to some embodiments of the present disclosure, an aspect of the present disclosure provides a method for manufacturing a semiconductor structure. The method includes: providing a base; forming a lower dielectric layer located on the base; forming a first lower conductive pillar, a second lower conductive pillar and a third lower conductive pillar located within the lower dielectric layer, in which the first lower conductive pillar is located in an array area, the second lower conductive pillar is located in a peripheral area, and the third lower conductive pillar is located in a core area; forming an upper dielectric layer located on the lower dielectric layer, in which the upper dielectric layer exposes a top surface of the first lower conductive pillar, a top surface of the second lower conductive pillar and a partial top surface of the third lower conductive pillar; and forming a first upper conductive pillar, a second upper conductive pillar and a third upper conductive pillar located within the upper dielectric layer, in which, the first upper conductive pillar and the first lower conductive pillar constitute a first conductive pillar, the second upper conductive pillar and the second lower conductive pillar constitute a second conductive pillar, the third upper conductive pillar and the third lower conductive pillar constitute a third conductive pillar, and a top surface area of the third lower conductive pillar is larger than a top surface area of the third upper conductive pillar.

According to some embodiments of the present disclosure, another aspect of the present disclosure further provides a semiconductor structure. The semiconductor structure includes a base on which a lower dielectric layer is provided; a first lower conductive pillar, a second lower conductive pillar and a third lower conductive pillar that are located within the lower dielectric layer, in which the first lower conductive pillar is located in an array area, the second lower conductive pillar is located in a peripheral area, and the third lower conductive pillar is located in a core area; an upper dielectric layer located on the lower dielectric layer, in which the upper dielectric layer exposes a top surface of the first lower conductive pillar, a top surface of the second lower conductive pillar, and a partial top surface of the third lower conductive pillar; and a first upper conductive pillar, a second upper conductive pillar and a third upper conductive pillar that are located within the upper dielectric layer; in which the first upper conductive pillar and the first lower conductive pillar constitute a first conductive pillar, the second upper conductive pillar and the second lower conductive pillar constitute a second conductive pillar, the third upper conductive pillar and the third lower conductive pillar constitute a third conductive pillar, and a top surface area of the third lower conductive pillar is larger than a top surface area of the third upper conductive pillar.

BRIEF DESCRIPTION OF THE DRAWINGS

One or more embodiments are illustrated by the drawings, which do not constitute a limitation on the embodiments, unless specifically stated, the figures in the drawings do not constitute scale limitations.

DETAILED DESCRIPTION

The semiconductor structure may include an array area, a peripheral area and a core area. The core area is closely connected to the array area, the core area has a unique device structure such as a word-line driver, and the peripheral area is used to ensure that the function of the core area is realized. When the dimension of the semiconductor structure is reduced, the dimension of the three areas must be reduced accordingly, which results in the high resistance of a conductive pillar in the core area and the electrical performance of the core area cannot be effectively improved.

The embodiments of the present disclosure provide a method for manufacturing a semiconductor structure. The method includes: forming a first lower conductive pillar, a second lower conductive pillar and a third lower conductive pillar that are located within a lower dielectric layer; forming an upper dielectric layer that is located on the lower dielectric layer, in which the upper dielectric layer exposes a top surface of the first lower conductive pillar, a top surface of the second lower conductive pillar and a partial top surface of the third lower conductive pillar; and forming a first upper conductive pillar, a second upper conductive pillar and a third upper conductive pillar that are located within the upper dielectric layer, in which a top surface area of the third lower conductive pillar is larger than a top surface area of the third upper conductive pillar. A larger dimension of the third lower conductive pillar can reduce the resistance and improve the electrical performance, while the upper dielectric layer exposes the third upper conductive pillar having a smaller dimension, so that the wrong electrical connection between the third upper conductive pillar and other conductive structures can be avoided. Furthermore, the manufacturing processes of the first lower conductive pillar, the second lower conductive pillar, and the third lower conductive pillar can be compatible so that the three can be formed in the same process step.

In order to make the objectives, technical solutions and advantages of the embodiments in the present disclosure clearer, the embodiments of the present disclosure will be described in detail in combination with the drawings in the following. However, those of ordinary skill in the art will appreciate that many technical details have been proposed in each embodiment of the present disclosure to make the present disclosure better understood. However, the technical solutions claimed in the present disclosure can be realized even without these technical details and various changes and modifications based on the following embodiments.

Figure 1:
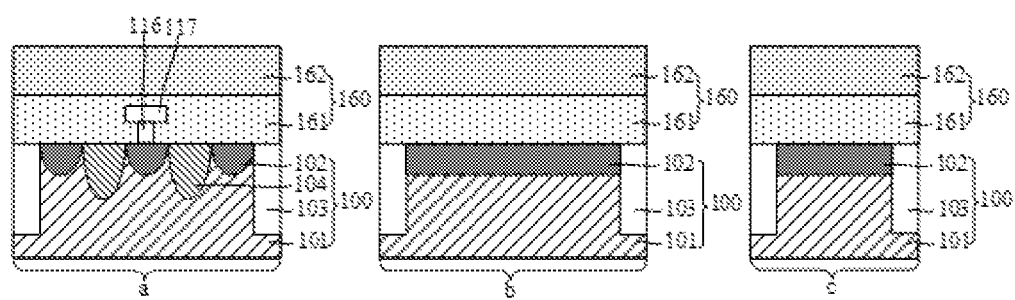
FIGS. 1-11 are schematic diagrams corresponding to each step in a method for manufacturing a semiconductor structure according to embodiments of the present disclosure.

An embodiment of the present disclosure provides a method for manufacturing a semiconductor structure. FIGS. 1-11 are schematic diagrams corresponding to each step in a method for manufacturing a semiconductor structure according to an embodiment of the present disclosure. FIG. 12 is a flowchart of a method for manufacturing a semiconductor structure according to an embodiment of the present disclosure. The following will be described in detail in combination with the drawings. Referring to FIG. 1, a semiconductor structure includes an array area a, a peripheral area b, and a core area c. In some embodiments, the semiconductor structure may be a dynamic random access memory (DRAM). The array area a is suitable for the formation of a transistor, a word-line, a bit-line, and the like, the core area c is suitable for the formation of a device structure such as a word-line driver, and the peripheral area b is used to ensure that the functions of the core area c are realized. A base 100 is provided, specifically, a substrate 101, an isolation structure 103 and an active area 102 are provided in the base 100 in each of the array area a, the peripheral area b, and the core area c. The material of the substrate 101 may be a semiconductor material, such as an elemental semiconductor material or a crystalline inorganic compound semiconductor material. The elemental semiconductor material may be silicon or germanium. The crystalline inorganic compound semiconductor material may be silicon germanide, gallium arsenide, indium gallide, or the like. The doping ion, such as boron or phosphorus, may also be present within the substrate 101. The material of the isolation structure 103 is an insulating material such as silicon oxide, silicon nitride, silicon oxynitride, or the like. The material of the active area 102 is a semiconductor material, and the doping ion is present in the active area 102, and further, the doping type of the active area 102 may be opposite to the doping type of the substrate 101.

In addition, in some embodiments, a gate electrode (not illustrated) is further provided in the base 100 of the core area c, and a word-line 104 is further provided in the base 100 of the array area a. The material of the gate electrode and the material of the word-line 104 may be the same, for example, may be tungsten. In other embodiments, the material of the gate electrode and the material of the word-line may also be different.

Figure 2:
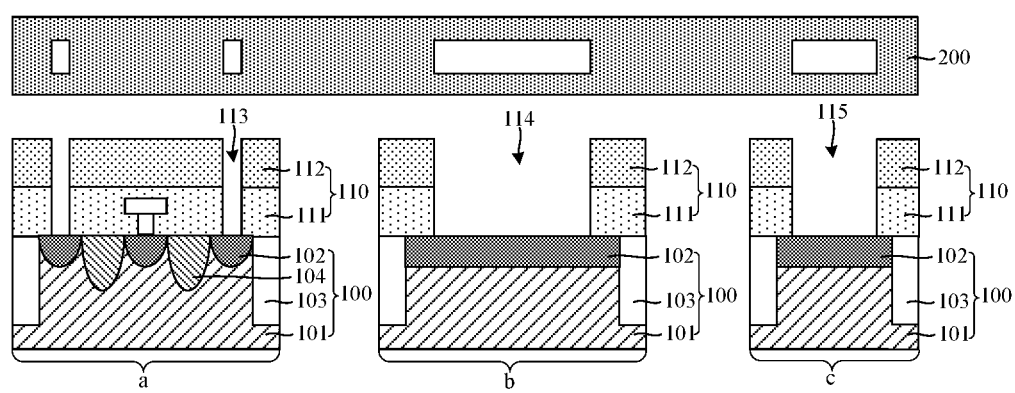

Referring to FIGS. 1-2, a lower dielectric layer 110 is formed on the base 100, and a plurality of conductive pillars shall be formed within the lower dielectric layer 110 in the follow-up operation, which can isolate the conductive pillars. In some embodiments, the lower dielectric layer 110 is a two-layered structure, and includes a first lower dielectric layer 111 and a second lower dielectric layer 112 which are laminated. In other embodiments, the lower dielectric layer may also be a single-layer structure, or a three-layer or more structure. The material of the lower dielectric layer 110 is an insulating material, such as silicon oxide, silicon nitride or silicon oxynitride.

Forming the lower dielectric layer 110 includes the following operations.

Referring to FIG. 1, an initial lower dielectric layer 160 covering the base 100 is formed. The initial lower dielectric layer 160 includes a first initial lower dielectric layer 161 and a second initial lower dielectric layer 162 that are laminated. In some embodiments, the first initial lower dielectric layer 161 and the second initial lower dielectric layer 162 may be formed by a chemical vapor deposition process.

A bit-line contact layer 116 and a bit-line conductive layer 117 are further provided in the initial lower dielectric layer 160 of the array area a. In some embodiments, the bit-line contact layer 116 and the bit-line conductive layer 117 may firstly be formed on the base 100, and then the initial lower dielectric layer 160 covering the bit-line contact layer 116 and the bit-line conductive layer 117 may be formed.

Referring to FIG. 2, the initial lower dielectric layer 160 is patterned to form the lower dielectric layer 110. Specifically, the lower dielectric layer 110 is etched using the mask plate 200 to form a first through hole 113, a second through hole 114 and a third through hole 115 within the lower dielectric layer 110. The first through hole 113 is located in the array area a, the second through hole 114 is located in the peripheral area b, and the third through hole 115 is located in the core area c. That is, the first through hole 113, the second through hole 114 and the third through hole 115 are formed in the same step, thus the manufacturing process can be simplified.

The first through hole 113 is subsequently used to be filled with the first lower conductive pillar, the second through hole 114 is subsequently used to be filled with the second lower conductive pillar, and the third through hole 115 is subsequently used to be filled with the third lower conductive pillar.

Figure 3:
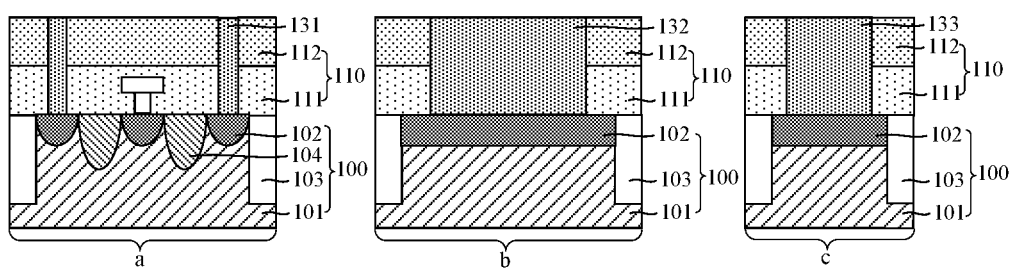

Referring to FIG. 3, the first lower conductive pillar 131, the second lower conductive pillar 132 and the third lower conductive pillar 133 are formed within the lower dielectric layer 110. The first lower conductive pillar 131 is located in the array area a, the second lower conductive pillar 132 is located in the peripheral area b, and the third lower conductive pillar 133 is located in the core area c. That is, the first lower conductive pillar 131 filling the first through hole 113 (referring to FIG. 2), the second lower conductive pillar 132 filling the second through hole 114 (referring to FIG. 2), and the third lower conductive pillar 133 filling the third through hole 115 (referring to FIG. 2) are formed.

The first lower conductive pillar 131 is electrically connected to the active area 102 within the array area a, the second lower conductive pillar 132 is electrically connected to the active area 102 of the peripheral area b, and the third lower conductive pillar 133 is electrically connected to the active area 102 and the gate electrode in the core area c.

The first lower conductive pillar 131, the second lower conductive pillar 132 and the third lower conductive pillar 133 are formed in the same step, thus the manufacturing process can be simplified. Specifically, the method for forming the first lower conductive pillar 131, the second lower conductive pillar 132 and the third lower conductive pillar 133 may be a physical vapor deposition method. In other embodiments, the method for forming may be a chemical vapor deposition method.

In some embodiments, the materials of the first lower conductive pillar 131, the second lower conductive pillar 132 and the third lower conductive pillar 133 are the same and all are the conductive materials, such as tungsten, copper, gold, silver, polysilicon, or the like. In other embodiments, the materials of the first lower conductive pillar 131, the second lower conductive pillar 132 and the third lower conductive pillar 133 may also be different.

In some embodiments, the shapes of the first lower conductive pillar 131, the second lower conductive pillar 132 and the third lower conductive pillar 133 are cuboid. In other embodiments, the shapes of the first lower conductive pillar, the second lower conductive pillar and the third lower conductive pillar may also be cylinder.

Figure 4:
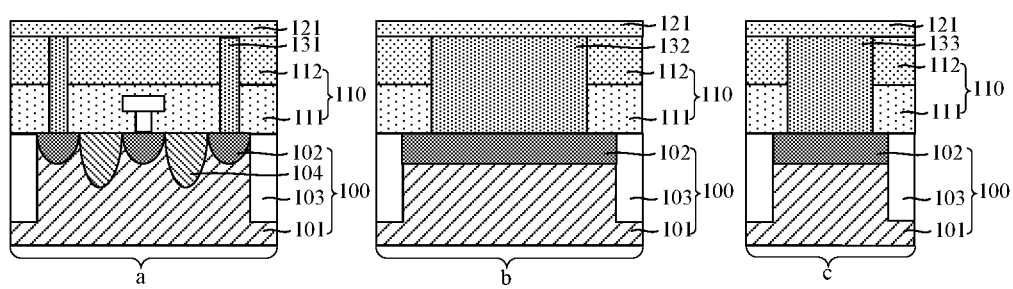
Figure 5:
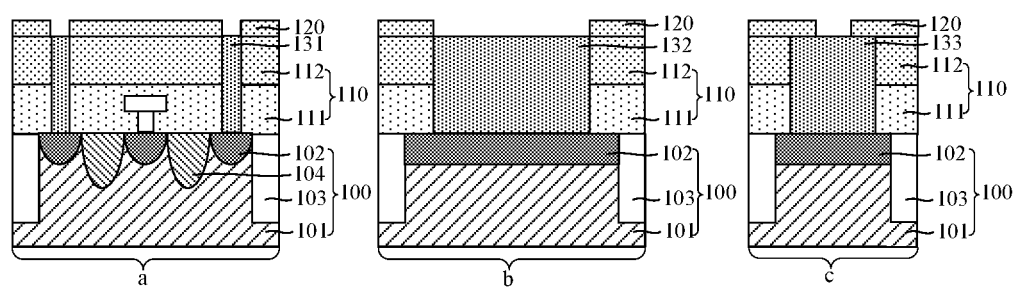

Referring to FIGS. 4-5, an upper dielectric layer 120 is formed on the lower dielectric layer 110, in which the upper dielectric layer 120 exposes the top surface of the first lower conductive pillar 131, the top surface of the second lower conductive pillar 132, and the partial top surface of the third lower conductive pillar 133. That is, the upper dielectric layer 120 exposes the entire top surfaces of the first lower conductive pillar 131 and the second lower conductive pillar 132, and covers the partial top surface of the third lower conductive pillar 133.

In some embodiments, the ratio of the thickness of the upper dielectric layer 120 to the thickness of the lower dielectric layer 110 in the direction perpendicular to the top surface of the base 100 ranges from $3/5$~$2/3$, such as may be $1/2$. When the ratio of the thicknesses of the two is within the above range, the third lower conductive pillar 133 and the subsequently formed third upper conductive pillar 143 (referring to FIG. 6) have appropriate thicknesses and further it can be ensured that the third conductive pillar composed of the third upper conductive pillar 143 and the third lower conductive pillar 133 has a small resistance, thereby improving the electrical performance of the third conductive pillar.

Forming the upper dielectric layer 120 includes the following operations.

Referring to FIG. 4, an initial upper dielectric layer 121 covering the lower dielectric layer 110, the first lower conductive pillar 131, the second lower conductive pillar 132 and the third lower conductive pillar 133 is formed.

In some embodiments, the material of the initial upper dielectric layer 121 is the same as that of the lower dielectric layer 110, for example both may be silicon nitride. In other embodiments, the material of the initial upper dielectric layer 121 may be different from the material of the lower dielectric layer 110.

In some embodiments, the initial upper dielectric layer 121 may be formed by chemical vapor deposition.

Referring to FIG. 5, the initial upper dielectric layer 121 is patterned to form the upper dielectric layer 120, in which a part of the initial upper dielectric layer 121 is etched to expose the entire top surfaces of the first lower conductive pillar 131 and the second lower conductive pillars 132 and to expose the partial top surface of the third lower conductive pillar 133.

Figure 6:
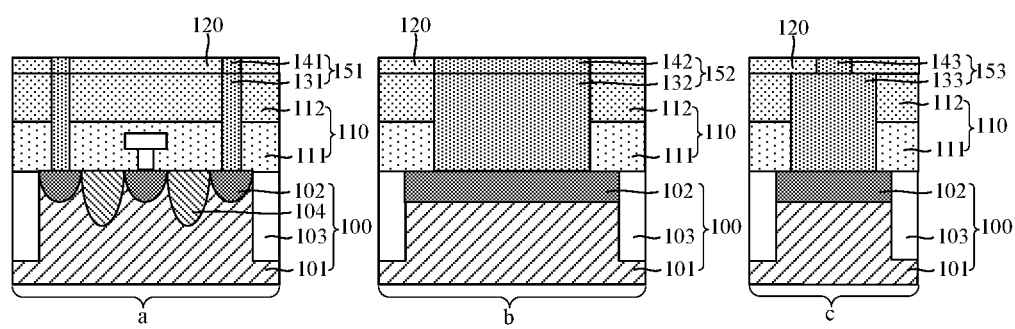

Referring to FIG. 6, a first upper conductive pillar 141, a second upper conductive pillar 142 and a third upper conductive pillar 143 are formed within the upper dielectric layer 120, in which the first upper conductive pillar 141 and the first lower conductive pillar 131 constitute a first conductive pillar 151, the second upper conductive pillar 142 and the second lower conductive pillar 132 constitute a second conductive pillar 152, the third upper conductive pillar 143 and the third lower conductive pillar 133 constitute a third conductive pillar 153, and the top surface area of the third lower conductive pillar 133 is larger than the top surface area of the third upper conductive pillar 143.

In some embodiments, the first upper conductive pillar 141, the second upper conductive pillar 142 and the third upper conductive pillar 143 are formed in the same process operation, thus the manufacturing process can be simplified.

The orthographic projection of the first upper conductive pillar 141 on the top surface of the first lower conductive pillar 131 coincides with the top surface of the first lower conductive pillar 131, and the orthographic projection of the second upper conductive pillar 142 on the top surface of the second lower conductive pillar 132 coincides with the top surface of the second lower conductive pillar 132. That is, the shape and dimension of the first upper conductive pillar 141 and the first lower conductive pillar 131 are the same, and the shape and size of the second upper conductive pillar 142 and the second lower conductive pillar 132 are the same.

In some embodiments, the orthographic projection of the top surface of the third upper conductive pillar 143 on the top surface of the third lower conductive pillar 133 falls within the top surface of the third lower conductive pillar 133. At this time, the size of the third upper conductive pillar 143 is smaller than that of the third lower conductive pillar 133, and the third upper conductive pillar 143 and the third lower conductive pillar 133 are directly opposite to each other. When the third upper conductive pillar 143 and the third lower conductive pillar 133 are directly opposite to each other, the contact surface of them have the largest area and the contact resistance is the lowest.

The ratio of the top surface area of the third upper conductive pillar 143 to the top surface area of the third lower conductive pillar 133 is less than $4/5$, may be such as $1/2$, $1/3$, or $1/4$. When the area ratio is within the above range, the probability that the third upper conductive pillar 143 is erroneously electrically connected can be reduced, and the resistance of the third conductive pillar 153 can be further reduced.

The ratio of the thickness of the third upper conductive pillar 143 to the thickness of the third lower conductive pillar 133 is in the range of $3/5$~$2/3$, and may be, for example, $1/2$. When the ratio of the thickness is within the above range, the third lower conductive pillar 133 has a larger volume, and thus the third lower conductive pillar 133 has a smaller resistance.

In some embodiments, the material of the third upper conductive pillar 143 is the same as the material of the third lower conductive pillar 133. When the materials of the third upper conductive pillar 143 and the third lower conductive pillar 133 are the same, the compatibility between them is greater and the interface defects between them are less. For example, both the material of the third upper conductive pillar 143 and the material of the third lower conductive pillar 133 may be copper.

In other embodiments, the material of the third upper conductive pillar 143 may be different from the material of the third lower conductive pillar 133, for example, the conductivity of the material of the third upper conductive pillar 143 is greater than the conductivity of the material of the third lower conductive pillar 133. For example, the material of the third upper conductive pillar 143 may be silver, and the material of the third lower conductive pillar 133 may be copper. As the volume of the third upper conductive pillar 143 is small, when the third upper conductive pillar 143 has a large conductivity, the total resistance of the third upper conductive pillar 143 is small, which is beneficial to improving the electrical performance of the third conductive pillar 153.

The relative positions of the third upper conductive pillar 143 and the third lower conductive pillar 133 will be described in detail below.

Firstly, it should be noted that, in some embodiments, since the shapes of the third upper conductive pillar 143 and the third lower conductive pillar 133 are cuboid, the cross-sectional shapes of the third upper conductive pillar 143 and the third lower conductive pillar 133 are rectangle in the direction parallel to the top surface of the base 100. In other embodiments, since the shapes of the third upper conductive pillar 143 and the third lower conductive pillar 133 may also be cylinder, the cross-sectional shapes of the third upper conductive pillar 143 and the third lower conductive pillar 133 may be circles correspondingly.

Figure 7:
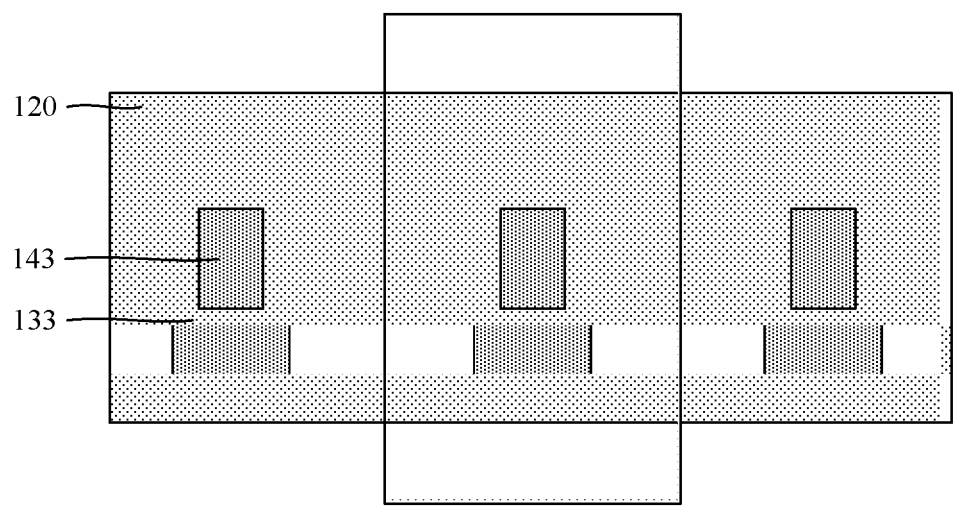

With reference to FIGS. 6 and 7, FIG. 7 is a top view of the core area c in FIG. 6. It should be noted that the left or right side area in FIG. 7 corresponds to the core area c illustrated in FIG. 6. The middle area in FIG. 7 is not illustrated in FIG. 6, and the third lower conductive pillar 133 in the middle area is electrically connected to the gate electrode within the base 100 of the core area c.

In some embodiments, the orthographic projection of the top surface of the third upper conductive pillar 143 on the top surface of the third lower conductive pillar 133 and the top surface of the third lower conductive pillar 133 together form an annular pattern.

At this time, the length of the third lower conductive pillar 133 is greater than the length of the third upper conductive pillar 143, and the width of the third lower conductive pillar 133 is greater than the width of the third upper conductive pillar 143. That is, the top surface area of the third lower conductive pillar 133 can be maximized, so the resistance of the third lower conductive pillar 133 can be further reduced.

Furthermore, the central axis of the third upper conductive pillar 143 in the direction perpendicular to the top surface of the base 100 coincides with the central axis of the third lower conductive pillar 133 in the direction perpendicular to the top surface of the base 100. In other embodiments, the central axis of the third upper conductive pillar 143 may also not coincide with the center axis of the third lower conductive pillar 133.

Figure 8:
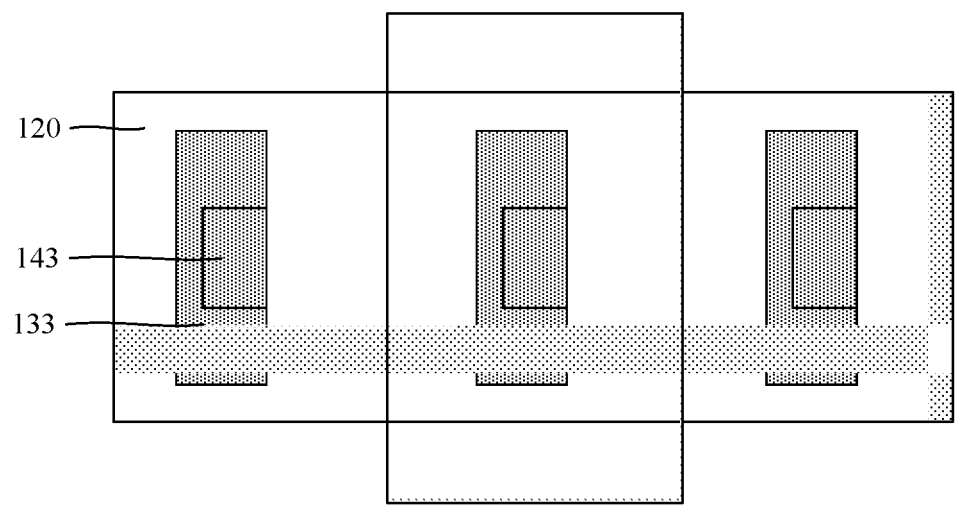

In other embodiments, referring to FIG. 8, one side wall of the third upper conductive pillar 143 may align with one side wall of the third lower conductive pillar 133.

Figure 9:
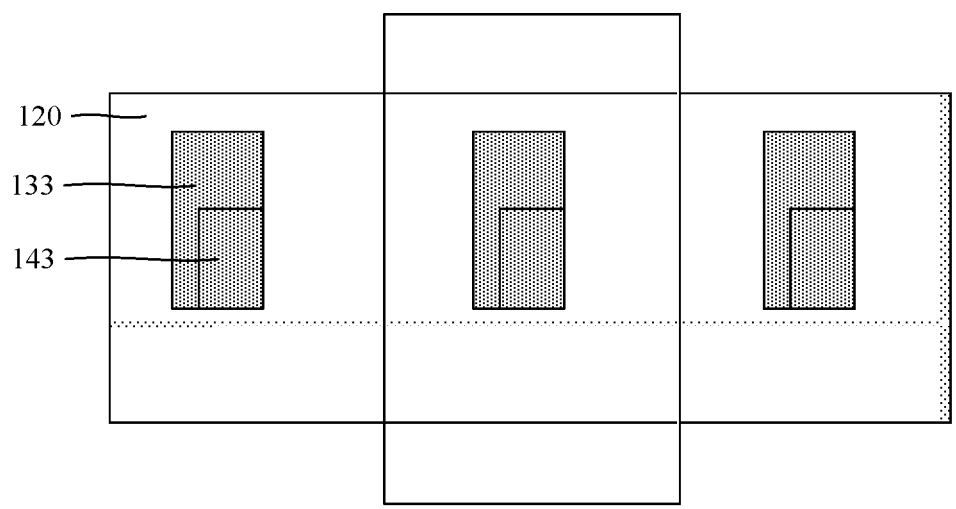
Figure 10:
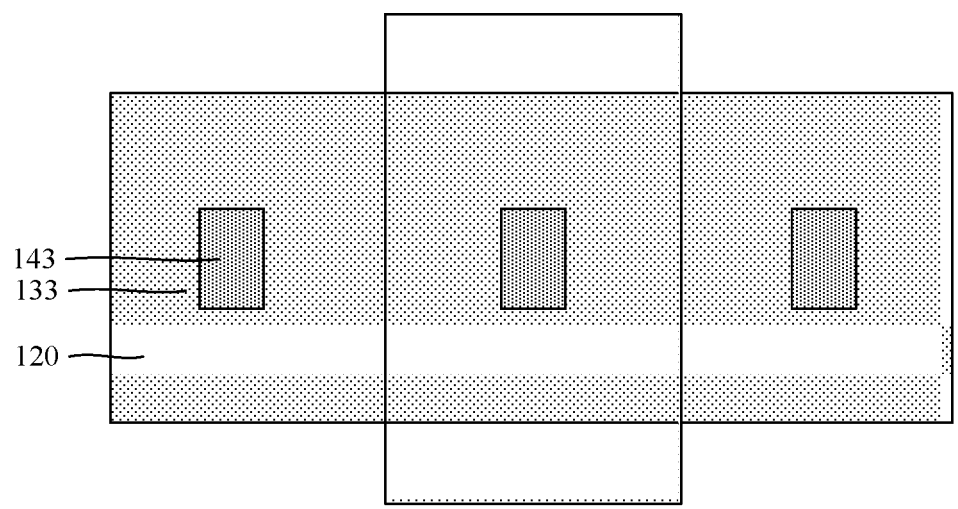

In still other embodiments, referring to FIGS. 9-10, two side walls of the third upper conductive pillar 143 align with two side walls of the third lower conductive pillar 133 respectively. Referring further to FIG. 9, the two side walls of the third upper conductive pillar 143 may be connected side walls. Referring to FIG. 10, the two side walls of the third upper conductive pillar 143 may be opposite side walls.

Figure 11:
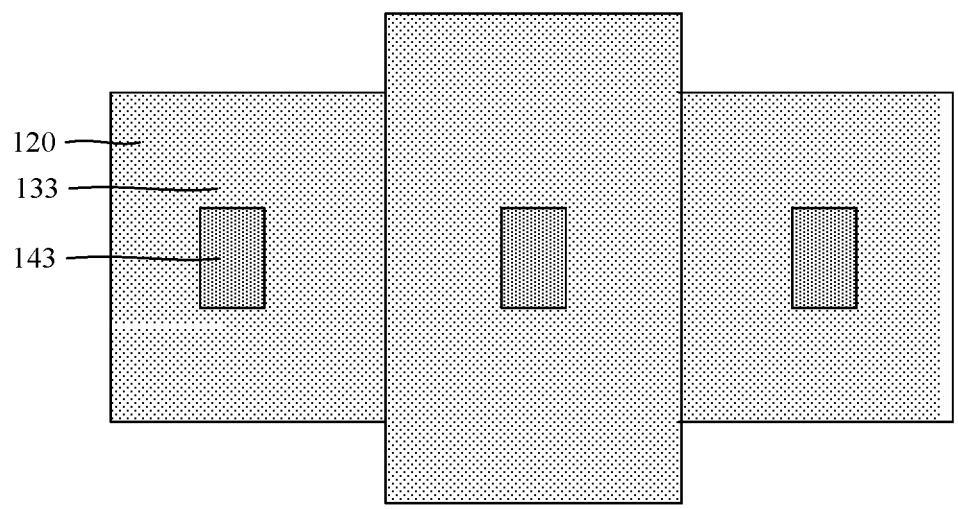
Figure 12:
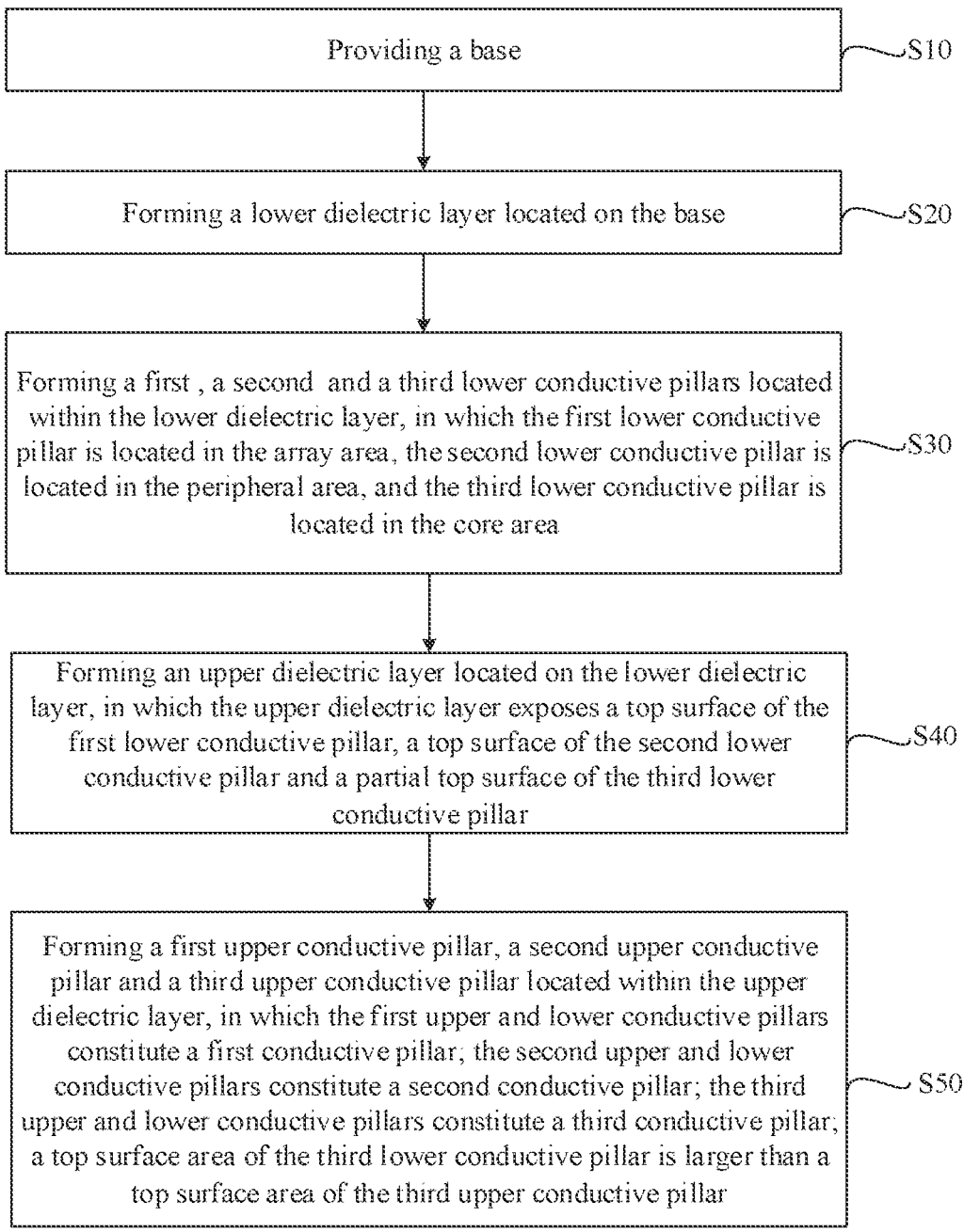
FIG. 12 is a flowchart of a method for manufacturing a semiconductor structure according to ab embodiment of the present disclosure.

In still other embodiments, referring to FIG. 11, three sidewalls of the third upper conductive pillar 143 align with three side walls of the third lower conductive pillar 133, respectively.

In the above several embodiments, the relative positions of the third upper conductive pillar 143 and the third lower conductive pillar 133 are different, but the volumes of the third upper conductive pillar 143 are respectively smaller than the volumes of the third lower conductive pillar 133, that is, the resistance of the third lower conductive pillar 133 can be reduced.

In conclusion, the third upper conductive pillar 143 and the third lower conductive pillar 133 are formed, and the top surface area of the third upper conductive pillar 143 is smaller than the top surface area of the third lower conductive pillar 133. In this way, the probability of short circuit between the third upper conductive pillar 143 and other conductive structures can be reduced, and the resistance of the third conductive pillar 153 can be reduced, thereby improving the electrical performance of the third conductive pillar 153. Furthermore, while the third conductive pillar 153 is formed, the formation process of the array area a and the peripheral area b is also taken into consideration, thereby optimizing the manufacturing process of the semiconductor structure.

Another embodiment of the present disclosure provides a semiconductor structure, and the semiconductor structure provided in the another embodiment of the present disclosure may be manufactured by the method for manufacturing a semiconductor structure according to the previous embodiment. FIG. 6 is a schematic diagram of the semiconductor structure according to an embodiment of the present disclosure. Referring to FIG. 6, the semiconductor structure includes: a base 100, in which a lower dielectric layer 110 is provided on the base 100; a first lower conductive pillar 131, a second lower conductive pillar 132 and a third lower conductive pillar 133 that are located within the lower dielectric layer 110, in which the first lower conductive pillar 131 is located in an array area a, the second lower conductive pillar 132 is located in a peripheral area b, and the third lower conductive pillar 133 is located in a core area c; an upper dielectric layer 120 that is located on the lower dielectric layer 110, in which the upper dielectric layer 120 exposes a top surface of the first lower conductive pillar 131, a top surface of the second lower conductive pillar 132 and a partial top surface of the third lower conductive pillar 133; and a first upper conductive pillar 141, a second upper conductive pillar 142 and a third upper conductive pillar 143 that are located within the upper dielectric layer 120, in which the first upper conductive pillar 141 and the first lower conductive pillar 131 constitute a first conductive pillar 151, the second upper conductive pillar 142 and the second lower conductive pillar 132 constitute a second conductive pillar 152, the third upper conductive pillar 143 and the third lower conductive pillar 133 constitute a third conductive pillar 153, and a top surface area of the third lower conductive pillar 133 is larger than a top surface area of the third upper conductive pillar 143. The parts of the embodiment of the present disclosure which are same as or similar to those of the previous embodiment are not described repeatedly, which can be referred to the detailed description of the previous embodiment.

The following will be described with reference to the drawings.

A substrate 101, an isolation structure 103, and an active area 102 are provided in each base 100 of the array area a, the peripheral area b, and the core area c. In this embodiment, a gate electrode is further provided in the base 100 of the core area c, and a word-line 104 is further provided in the base 100 of the array area a.

The first conductive pillar 151 is electrically connected to the active area 102. The second conductive pillar 152 is electrically connected to the active area 102. The third conductive pillar 153 is electrically connected to the gate electrode or active area 102.

The third conductive pillar 153 includes the third lower conductive pillar 133 and the third upper conductive pillar 143 that are laminated. In some embodiments, the shapes of the third upper conductive pillar 143 and the third lower conductive pillar 133 may be cuboid. In other embodiments, the shapes of the third upper conductive pillar 143 and the third lower conductive pillar 133 may also be cylinder.

The orthographic projection of the top surface of the third upper conductive pillar 143 on the top surface of the third lower conductive pillar 133 falls within the top surface of the third lower conductive pillar 133. At this time, the third upper conductive pillar 143 and the third lower conductive pillar 133 are directly opposite to each other, and the contact surface between the two have a maximum area and a minimum contact resistance.

The ratio of the thickness of the third upper conductive pillar 143 to the thickness of the third lower conductive pillar 133 is in the range of $3/5 \sim 2/3$, and may be, for example, $1/2$. When the ratio of the two thicknesses is within the above range, the third lower conductive pillar 133 has a larger volume, and thus the third lower conductive pillar 133 has a smaller resistance.

In conclusion, the top surface area of the third upper conductive pillar 143 is smaller than the top surface area of the third lower conductive pillar 133, so that the probability of short circuit between the third upper conductive pillar 143 and other conductive structures can be reduced, and the resistance of the third conductive pillar 153 can be reduced, thereby improving the electrical performance of the third conductive pillar 153.

Further referring to FIG. 12, it is flowchart showing the operations of a method for manufacturing a semiconductor structure according to an embodiment of the disclosure. The semiconductor structure comprises an array area, a peripheral area, and a core area, and the method comprises the following operations.

At S10, a base is provided.

At S20, a lower dielectric layer located on the base is formed.

At S30, a first lower conductive pillar, a second lower conductive pillar and a third lower conductive pillar located within the lower dielectric layer are formed. The first lower conductive pillar is located in the array area, the second lower conductive pillar is located in the peripheral area, and the third lower conductive pillar is located in the core area.

At S40, an upper dielectric layer located on the lower dielectric layer is formed. The upper dielectric layer exposes a top surface of the first lower conductive pillar, a top surface of the second lower conductive pillar and a partial top surface of the third lower conductive pillar.

At S50, a first upper conductive pillar, a second upper conductive pillar and a third upper conductive pillar located within the upper dielectric layer are formed. The first upper conductive pillar and the first lower conductive pillar constitute a first conductive pillar; the second upper conductive pillar and the second lower conductive pillar constitute a second conductive pillar; the third upper conductive pillar and the third lower conductive pillar constitute a third conductive pillar; and a top surface area of the third lower conductive pillar is larger than a top surface area of the third upper conductive pillar.

Those of ordinary skill in the art may understand that the above embodiments are specific examples for realizing the present disclosure, and in actual applications, various changes in form and details may be made without departing from the spirit and scope of the present disclosure. Anyone skilled in the art, without departing from the spirit and scope of the present disclosure, may make their own changes and modifications. Therefore, the protection scope of the present disclosure shall be subject to the scope defined by the claims.

The invention claimed is:

1. A method for manufacturing a semiconductor structure comprising an array area, a peripheral area, and a core area, the method comprising:
   providing a base;
   forming a lower dielectric layer located on the base;
   forming a first lower conductive pillar, a second lower conductive pillar and a third lower conductive pillar located within the lower dielectric layer; wherein, the first lower conductive pillar is located in the array area, the second lower conductive pillar is located in the peripheral area, and the third lower conductive pillar is located in the core area;
   forming an upper dielectric layer located on the lower dielectric layer, wherein, the upper dielectric layer exposes a top surface of the first lower conductive pillar, a top surface of the second lower conductive pillar and a partial top surface of the third lower conductive pillar; and
   forming a first upper conductive pillar, a second upper conductive pillar and a third upper conductive pillar located within the upper dielectric layer; wherein, the first upper conductive pillar and the first lower conductive pillar constitute a first conductive pillar; the second upper conductive pillar and the second lower conductive pillar constitute a second conductive pillar; the third upper conductive pillar and the third lower conductive pillar constitute a third conductive pillar; a top surface area of the third lower conductive pillar is larger than a top surface area of the third upper conductive pillar.

2. The method for manufacturing a semiconductor structure according to claim 1, wherein an orthographic projection of a top surface of the third upper conductive pillar on a top surface of the third lower conductive pillar falls within the top surface of the third lower conductive pillar.

3. The method for manufacturing a semiconductor structure according to claim 2, wherein the orthographic projection of the top surface of the third upper conductive pillar on the top surface of the third lower conductive pillar and the top surface of the third lower conductive pillar together constitute an annular pattern.

4. The method for manufacturing a semiconductor structure according to claim 2, wherein a shape of the first lower conductive pillar, a shape of the second lower conductive pillar and a shape of the third lower conductive pillar comprise a cuboid or a cylinder.

5. The method for manufacturing a semiconductor structure according to claim 1, wherein cross-sectional shapes of the third upper conductive pillar and the third lower conductive pillar are rectangles in a direction parallel to a top surface of the base; one side wall of the third upper conductive pillar aligns with one side wall of the third lower conductive pillar; or, two side walls of the third upper conductive pillar align with two side walls of the third lower conductive pillar respectively; or, three side walls of the third upper conductive pillar align with three side walls of the third lower conductive pillar respectively.

6. The method for manufacturing a semiconductor structure according to claim 1, wherein a ratio of the top surface area of the third upper conductive pillar to the top surface area of the third lower conductive pillar is less than $4/5$.

7. The method for manufacturing a semiconductor structure according to claim 1, wherein a ratio of a thickness of the upper dielectric layer to a thickness of the lower dielectric layer in a direction perpendicular to a top surface of the base is in a range of $3/5 \sim 2/3$.

8. The method for manufacturing a semiconductor structure according to claim 1, wherein a plurality of active areas are provided in the base, and the active areas are electrically connected to the first conductive pillar, the second conductive pillar and the third conductive pillar, respectively.

9. The method for manufacturing a semiconductor structure according to claim 1, wherein a gate electrode is provided in the base of the core area, and the gate electrode is electrically connected to the third conductive pillar.

10. The method for manufacturing a semiconductor structure according to claim 1, wherein an orthographic projection of the first upper conductive pillar on the top surface of the first lower conductive pillar coincides with the top surface of the first lower conductive pillar, and an orthographic projection of the second upper conductive pillar on the top surface of the second lower conductive pillar coincides with the top surface of the second lower conductive pillar.

11. The method for manufacturing a semiconductor structure according to claim 1, wherein a material of the third upper conductive pillar is the same as a material of the third lower conductive pillar.

12. The method for manufacturing a semiconductor structure according to claim 1, wherein a conductivity of a material of the third upper conductive pillar is greater than a conductivity of a material of the third lower conductive pillar.

13. The method for manufacturing a semiconductor structure according to claim 1, wherein a material of the first lower conductive pillar, a material of the second lower conductive pillar, and a material of the third lower conductive pillar are the same.

14. The method for manufacturing a semiconductor structure according to claim 1, wherein forming the upper dielectric layer comprises: forming an initial upper dielectric layer covering the lower dielectric layer, the first lower conductive pillar, the second lower conductive pillar and the third lower conductive pillar; and patterning the initial upper dielectric layer to form the upper dielectric layer.

15. The method for manufacturing a semiconductor structure according to claim 1, wherein forming the lower dielectric layer comprises: forming an initial lower dielectric layer covering the base; and patterning the initial lower dielectric layer to form the lower dielectric layer.

\* \* \* \* \*